United States Patent
Young et al.

(10) Patent No.: US 6,275,039 B1
(45) Date of Patent: Aug. 14, 2001

(54) MAGNETIC RESONANCE PRE-POLARIZATION APPARATUS

(75) Inventors: Ian Robert Young, Marlborough; John Frederick Eastham, Bath, both of (GB)

(73) Assignee: Picker International, Inc., Cleveland, OH (US)

(*) Notice: Subject to any disclaimer, the term of this patent is extended or adjusted under 35 U.S.C. 154(b) by 0 days.

(21) Appl. No.: 09/124,656

(22) Filed: Jul. 29, 1998

(30) Foreign Application Priority Data

Jul. 29, 1997 (GB) .................................. 9715938
Feb. 20, 1998 (GB) .................................. 9803624

(51) Int. Cl.[7] .................................. G01V 3/00
(52) U.S. Cl. .................. 324/319; 324/300; 324/307; 324/306; 324/318; 324/309
(58) Field of Search .................. 324/300, 309, 324/318, 319, 307, 306

(56) References Cited

U.S. PATENT DOCUMENTS

| | | | |
|---|---|---|---|
| 5,296,811 | 3/1994 | Ehnholm et al. | 324/319 |
| 5,563,564 | * 10/1996 | Chu et al. | 335/216 |
| 5,936,404 | * 8/1999 | Ladebeck et al. | 324/300 |

* cited by examiner

Primary Examiner—Christine Oda
Assistant Examiner—Brij B. Shrivastav
(74) Attorney, Agent, or Firm—John J. Fry; Thomas M. Lundin

(57) ABSTRACT

Interventional MRI imaging leads to the development of open magnets such as for example C-magnet 1, in which it is correspondingly more difficult to generate a large field in order to obtain a good signal-to-noise ratio. To overcome this, a pre-polarizing unit 7 is provided which utilizes a HTSC magnet, for example of YBCO, which is brought adjacent to the patient to assist in generating the main field, and then rapidly withdrawn to position 8, in order to enable the r.f. signals to be detected in the presence of the field of the C-magnet 1.

21 Claims, 5 Drawing Sheets

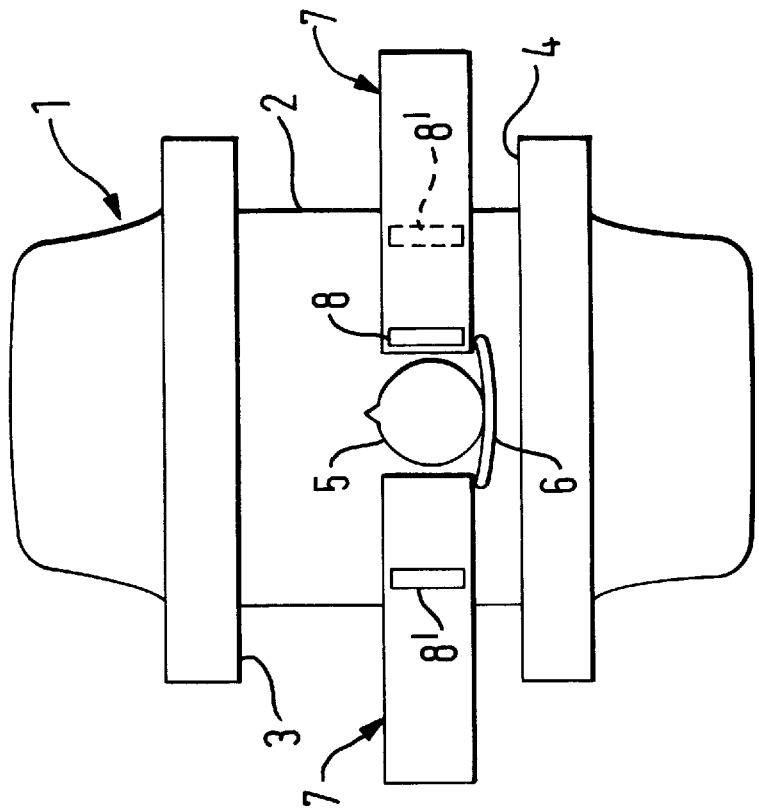
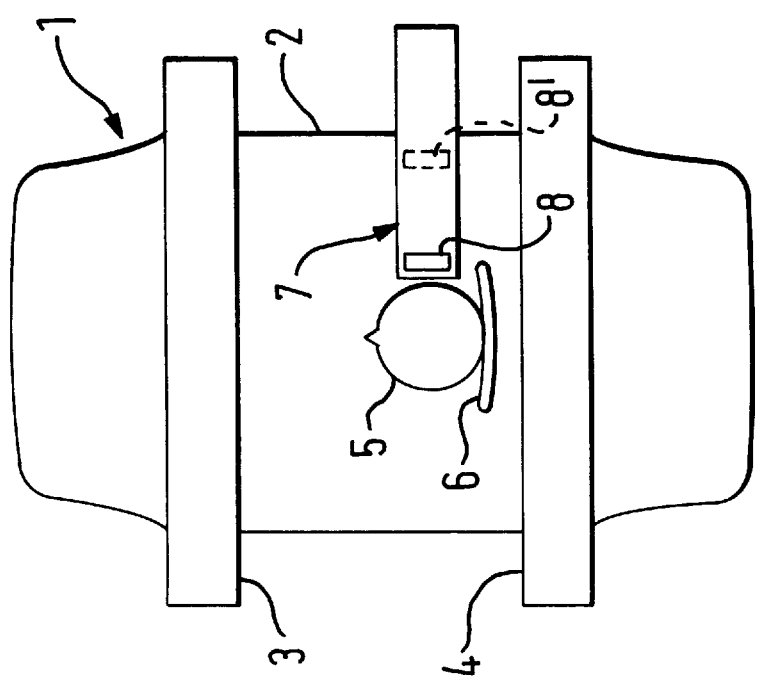

MAGNETIC RESONANCE PRE-POLARIZATION APPARATUS

BACKGROUND

The present invention relates to magnetic resonance imaging (MRI) apparatus and more particularly is concerned with a technique known as pre-polarisation by which a low magnetic field may be temporarily increased for the purpose of enhancing the sensitivity of a relatively low field NMR (Nuclear Magnetic Resonance) experiment.

The aforementioned pre-polarisation technique will now be described by way of background information.

This is a technique in which a large low quality magnetic field is temporarily applied to an object to be studied by NMR particularly in an NMR environment where there is a low, or even zero magnetic field. With this technique a large field is first applied for a period to cause the target object to become magnetised to a level related to that field. The magnetisation produced by the high field develops with the time constant T1 characteristic of the high field.

The polarising field is then very rapidly removed so that the target object magnetisation decays back towards that which was applied originally with the value of the time constant T1 which is characteristic of the lower field.

This allows quite a long period (typically less than 0.5 T1 at the low field) during which data can be recovered but during which the magnetisation in the target object is well above what would be expected in the low field. Thus it is possible, in principle, to enhance the sensitivity of a low field NMR experiment quite substantially using this technique as long as the time constants with which the magnetisation decays are long compared with the time taken to remove the pre-polarisation field.

Pre-polarisation has been proposed as a possibility for low field MRI (U.S. Pat. No. 5,296,811) but, as yet, has not been demonstrated in vivo. This is because at all except the lowest fields or with poorly coupled coils, detector noise in human MRI is dominated by noise from the patient's body itself, and most current machines operate at sufficiently high fields for this to be true. It has been pointed out that, even at best, the signal-to-noise ratio is proportional to $B_0$, the magnitude of the main field. In practice, the gain is less than that because of timing limitations.

The Applicants have however appreciated that one major advantage of pre-polarisation as against attempting to increase the main magnetic field level is that the quality i.e. degree of uniformity of pre-polarising field required is relatively low.

The rapid development of interventional MRI is the principal driver leading to the development of increasingly open magnets, allowing much better access to patients than that allowed by the traditional experimental configuration. Improved accessibility is, however, paid for by the difficulty of achieving high field levels in otherwise useful designs. Pre-polarisation offers the possibility of getting substantially enhanced images from local regions of the body of immediate concern to a clinician performing a procedure.

SUMMARY

The invention provides apparatus for magnetic resonance imaging, comprising a magnet for generating a magnetic field through an imaging region, means for applying r.f. pulses to, and creating magnetic field gradients in, the imaging region, a high temperature superconducting magnet (HTSC) arranged adjacent to the imaging region to provide an increased main magnetic field, and means for rapidly withdrawing the HTSC magnet away from the imaging region.

The HTSC magnet provides a powerful pre-polarising field, but can be withdrawn to enable data acquisition to be conducted under the much higher quality field of the first-mentioned magnet. By high temperature superconductor, it is meant a superconductor which has a transition temperature of substantially more than 20° K.

According to another apsect, magnetization of an actuator having a permanent magnet rotor is facilitated by the use of a transient current pulse applied to the stator. The technique is especially well suited for use where the rotor includes an HTSC material such as YBCO.

DRAWINGS

An apparatus for magnetic resonance imaging constructed in accordance with the invention will now be described, by way of example, with reference to the accompanying drawings, in which:

FIG. 1 is a diagrammatic front view of a first embodiment of the invention employing one pre-polarising unit shown in a particular "C"-shaped iron-yoked magnet;

FIG. 2 is a diagrammatic front view of a second embodiment of the invention employing two pre-polarising units shown in the same form of magnet;

DESCRIPTION

Figure 3:
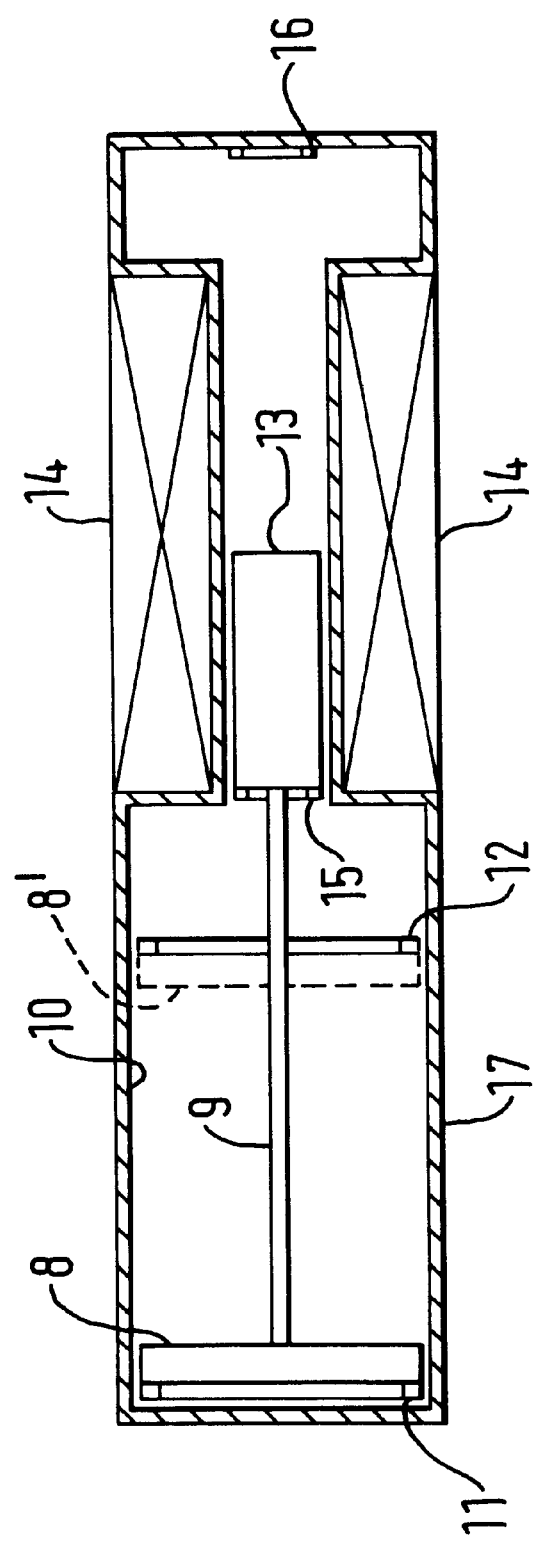
FIG. 3 is a front view, partly diagrammatic and partly in section, showing a first pre-polarising unit for use in the MRI apparatus of FIG. 1 or FIG. 2.

Before describing the invention in more detail, the theory behind pre-polarisation will now be outlined.

If the region of the body to be enhanced is in a field $B_{0ref}$, and a pre-polarisation field is applied which has a magnitude $B_{0pp}$ at a point P, and is oriented to $B_{0ref}$ at an inclusive angle $\theta_p$, then the magnetisation of the sample at $P(M_{pp})$ develops as:

$$M_{pp} \alpha \{B_{0ref}^2 + B_{0pp}^2 + 2B_{0ref}B_{0pp} \cos \theta\}^{1/2}(1-\exp(-t/T1_{pp})) + B_{0ref}\exp(-t/T1_{pp})$$

where $T1_{pp}$ is the value of the T1 of the material at P at the local (high) field (in vector notation $(\tilde{B}_0 + \tilde{B}_{0pp})$), and t is the time after application of the enhancing field.

Assuming that $B_0{_{ref}}$ is constant (to within MRI limit of 5–10 ppm) throughout the whole region of interest, the amplitude of its excited magnetisation will be modulated by the local values of $B_0{_{pp}}$ and $\theta_p$. However these are geometrically determined quantities (as well as being controlled by the applied field generating agency) and can be corrected for variations if necessary.

After a time t' after the removal of the pre-polarising field the magnetisation is then:

$$M_{pp} \alpha \{B_{0ref}^2 + B_{0pp}^2 + 2B_{0ref}B_{0pp} \cos \theta\}^{1/2}(1-\exp(-t/T1_{pp}))\exp(-t/T1_{ref}) + B_{0ref}(1-\exp(-t/T1_{pp}))\exp(t^1/T1_{ref})$$

where $T1_{ref}$ is the T1 at the point P in the low ($B_0{_{ref}}$) field.

Typically, in tissue the value of T1 has been observed to have an empirical relation to the field strength given by:

$$Tl_A = Tl_B \left(\frac{B_{0A}}{B_{0B}}\right)^v$$

where v is in the range of 0.3–0.4 in the range of fields normally used for whole body MRI. ($B_{0A}$ and $B_{0B}$ are the two field levels at which the comparison is being made).

By way of example, if we take the lower field of current interest ($B_{0B}$) to be 0.1 T (Tesla), and the maximum value of $B_{0A}$ which is likely to be really obtainable as 1.0 T, then $T1_{(A)} \approx (2.0-2.5) T1_{(B)}$.

The values of T1 for human tissue which are commonly encountered range from that of fat (of the order of 150 msec in the 0.1–0.2 T range) to cerebo-spinal fluid with a T1 of around 3.5–4 seconds, which does not vary significantly with the strength of the magnetic field. Typically T1 for the main tissues of interest lie in the range 250–800 msec in 0.1 to 0.2 T fields.

A typical mid-range tissue might be grey matter in the brain with a T1 of 500–550 msec. Then application of a pre-polarisation field of 2.0 T for two seconds, followed by data acquisition at 100 msec after nominal removal of the field would result in a magnetisation gain of 6.91 in a machine operating at 0.2 T for tissue with a $T1_{ref}$ of 500 msec. For simplicity it is assumed the pre-polarising field was applied orthogonal to the main field. Thus, locally, this would result in a signal-to-noise ratio gain of around 8.

The preferred method of producing a pre-polarising field of the intensity proposed is the use of a melt-quenched high temperature superconductor (HTSC). A block of this material (such as YBCO [yttrium barium copper oxide, typically having the composition $YBa_2 Cu_3O_{7-x}$]) 150 mm in diameter, 40 mm thick and magnetised to have a $B_{REM}$ of 4 T can produce in excess of 2 T at a depth of 30 mm into the head of a patient (allowing for insulation, vacuum containment etc.).

One possible embodiment of MRI apparatus incorporating a pre-polarising unit will now be described with reference to the drawings.

The first embodiment of magnetic resonance imaging apparatus comprises a C-magnet 1 comprising a yoke 2 joining pole pieces 3, 4. The faces of the pole pieces 3, 4 lie in a horizontal plane. The patient lies down horizontally with his/her axis extending perpendicular to the plane of the drawing. The head 5 of the patient rests upon a support 6 and the pre-polarising unit 7 is adjacent to the patient's head.

In addition to the main field provided by the C-magnet 1, which is typically of the order of 0.2 T, there are provided gradient coils (not shown) in order to enable the r.f. signals detected to be spatially encoded. The gradient coils set up magnetic field gradients in three directions at right angles. An r.f. excitation coil (not shown) is provided in order to excite nuclear magnetic resonance in the nuclei of various tissues of the patient, and a receiving coil (not shown) is also provided to detect the r.f. signals emitted by the nuclei. One coil may be used to perform both functions.

In accordance with the invention, a HTSC magnet 8 is brought to a position adjacent to the patient's head to assist in the polarising process. It is then rapidly withdrawn to a position 8' to allow the r.f. signals from the patient to be detected under the influence of the field of the C-magnet 1.

The second embodiment of MRI apparatus of the invention described with reference to FIG. 2 of the drawings, is the same as the first, except that an additional pre-polarising unit 7 is provided on the other side of the patient and except for size. The second unit 7 is the same as the first unit. Typically, the magnets 8 of FIG. 2 will be of larger diameter than those of FIG. 1.

While the direction of the magnetic field between the pole pieces 3 and 4 is in a vertical direction, the direction of the magnetic field from the powerful magnet formed by the HTSC block is in a horizontal direction i.e. orthogonal to the field from the C-magnet.

In general, the quality of the field (i.e. variation in strength across it) will vary with field strength. However, the field quality of the HTSC magnet 8 can be 1000 times less good than that of the C-magnet 1, but the amplitude will still only vary by around 1%. This would be totally unacceptable for data acquisition, but so long as the pre-polariser 8 is withdrawn before data acquisition takes place, the use of the low quality high strength field for pre-polarisation is not a disadvantage.

A first form of the pre-polarising unit 7 is shown in detail in FIG. 3. The HTSC block 8 is attached to a copper backplate (not shown) and insulating connecting rod 9 and runs inside an inner glass fibre tube 10 along guides (not shown). The block 8 and its copper support plate rest against cooling rings 11, 12 (split to stop eddy currents) at the front and rear extremities of its motion. These rings 11, 12, and the connecting guides are cooled by one cold finger attached to a two stage cryogenic refrigerator which has a cooling power of 5 W at 20° K. The block 8 is therefore cooled at the extremities of its motion, but the motion is so fast that magnetisation is not lost in the process. The means for rapidly withdrawing the superconducting magnet from the imaging region is a linear motor consisting of an HTSC rotor 13 and three-phase windings 14. The motor is of the reluctance type. The rotor is cooled at the corresponding extremities of its motion by cooling rings 15 and 16 which are refrigerated via a separate cold finger, and can be at a different temperature to the block 8.

The motor stator is wound from water-cooled hollow copper conductor, which can be transiently pulsed at a current level substantially greater than the normal operating current, with the windings correctly connected, to polarise the stator independently of the main HTSC block. The resulting field will extend radially from the rotor. The motor is designed to run the HTSC block rearwards very fast, to be stopped by a spring and clamped in the out position by a brake (not shown). The motor can be driven forward in a slower, controlled manner, (as this just means a slower build-up of magnetisation, and is not critical in terms of performance in the way removal is).

Typical sizes are a diameter of 35 mm for the block 8 for FIG. 1 and 150 mm for FIG. 2, and a run of 40 cm between its inner and outer positions. The field is fixed in intensity at HTSC, but varies in space (and time as block is moved). This distance is enough to allow a magnetisation cycle comprising the following steps.

First, the rings 11, 12 are cooled to 20° K (thereby cooling the main block 8 ), while maintaining the cooling rings 15 and 16 above the critical temperature. The main block 8 is then polarised using an external high field magnet. This magnet is then removed, whereupon the rings 15, 16 are cooled to 20° K. The rotor 11 is now polarised by configuring the three-phase windings temporarily and pulsing the windings to generate a core field of 2 to 3 T. The water cooling of the copper conductor is taken advantage of to pass a very high transient current (much more than normal) to excite the HTSC rotor. The block 8 is far enough away for its field to be dominated by that from the windings.

The inner glass fibre tube 10 is contained within an outer tube 17, and the space between them is evacuated, in order that the temperature on the outside of the pre-polarising unit e.g. in the vicinity of the patient, is at room temperature.

MRI field qualities are such that even in the retracted position the field in the region of interest is significantly distorted by the permanent magnet pre-polarising unit 7. With the small polariser of FIG. 1, and small field of view, the r.f. detector system, which will initially be external to the cylinder, and at room temperature, will be sensitive to a volume small enough for components due to the residual field to be ignored, or, at worst, corrected by a simple shimming system (using the gradient coils, as linear corrections).

With the larger polariser of FIG. 2, with which a refrigerated detector coil may be employed, the existence of transverse field gradients will become very apparent. With a 200 mm diameter pre-polariser, even at the centre of an adult head, and assuming the parameters used previously, the boost in field is still a factor 2.47.

In order to make the system symmetrical and eliminate transverse field two pre-polarisers are provided in the embodiment of FIG. 2, one on each side of the head, and magnetised in the same direction (so that the south pole of one faces the north pole of the other). The purpose is to cancel the effect of the magnets 8 when data acquisition using the receiver coil takes place, both magnets being in the retracted position. Only one magnet 8 of course is adjacent to the patient in order to conduct the initial polarisation of the tissues to be examined. The enormous forces on the polarisers in close proximity means that only one side of the patient can be polarised at a time. In the sensitive regions, additional shim coils will be needed to correct for the residual field gradients. Even order axial shims will be included in the system as a whole (with odd orders being unnecessary as long as orthogonality between the pre-polarisation axes and $B_0$ is maintained). Shimming using iron powder discs or small coils, is needed to correct high order, and cross, terms.

The second pre-polarising magnet could be fixed in the retracted position, but it would be preferable for it to be retractable like the first, in order than either side of the patient may be imaged.

Though the complete image cycle is extended to perhaps 5 seconds, the use of techniques such as echo planar imaging allows acquisition of a complete image at each polarisation, so that a gain in sensitivity is achieved at each half cycle, and the effective gain in signal-to-noise ratio of the centre of the system is multiplied by $\sqrt{2}$ over the 5 second cycle.

The noise can be assumed to be Johnson, so that an overall performance gain of 3.49 at the centre of the head rising to just over 7 at the edges can be predicted.

Even in the larger system of FIG. 2, the weight of the moving part of the device is no more than about 6 kg. The force required to overcome mechanical inertia and accelerate the pre-polariser fast enough is less than 900 N with allowance for friction etc. The magnetic forces when the larger system is used as part of an alternated pair amount to a further 360 N or so, mean the total starting drive force needed in the retraction unit is around 1.26 kN. For the small, single sided pre-polariser, the power required is quite small—assuming a total weight of 1.5 kg, and no magnetic attractions to overcome, the starting force needed is 260 N (again with a small allowance for friction). A typical time for withdrawal of the magnets 8 to position 8' is 100 ms.

Mechanical alignment of the pre-polarising system is important, as the force calculations above rely on the polariser travelling orthogonal to the main field. Symmetry is important in maintaining performance, and will be needed in aligning the system. Some of the modern interventional magnets are being designed for rapid switching off and on, so in many instances it will be possible to position the pre-polarising unit (if not always installed) in the absence of the main field. The pre-polarisers therefore will be magnetised at the time of installation. Total unit weight of the smaller polariser (including refrigerator, but excluding its supports) is estimated to be 50 kg, and of the large 120 kg.

The pre-polarisers will require to be magnetised—and in a high field (of the order of 1.6 times the proposed $B_{rem}$. The method of magnetisation will be to pass the HTSC components in this assembly through a low quality, but very high field, cryogenic magnet. (Peak field is the important factor, and not the quality (uniformity) of the field). If located at a conveniently short distance from the actual machine, this unit can also be used to pre-polarise saline and other metabolites to be given by high speed injection to the patient. Once the pre-polariser is magnetised it should remain so until the temperature rises and the supercurrents quench.

Initially, the r.f. detector can be external to the cryostat for the pre-polariser, or it can be refrigerated and incorporated in it.

Figure 6:
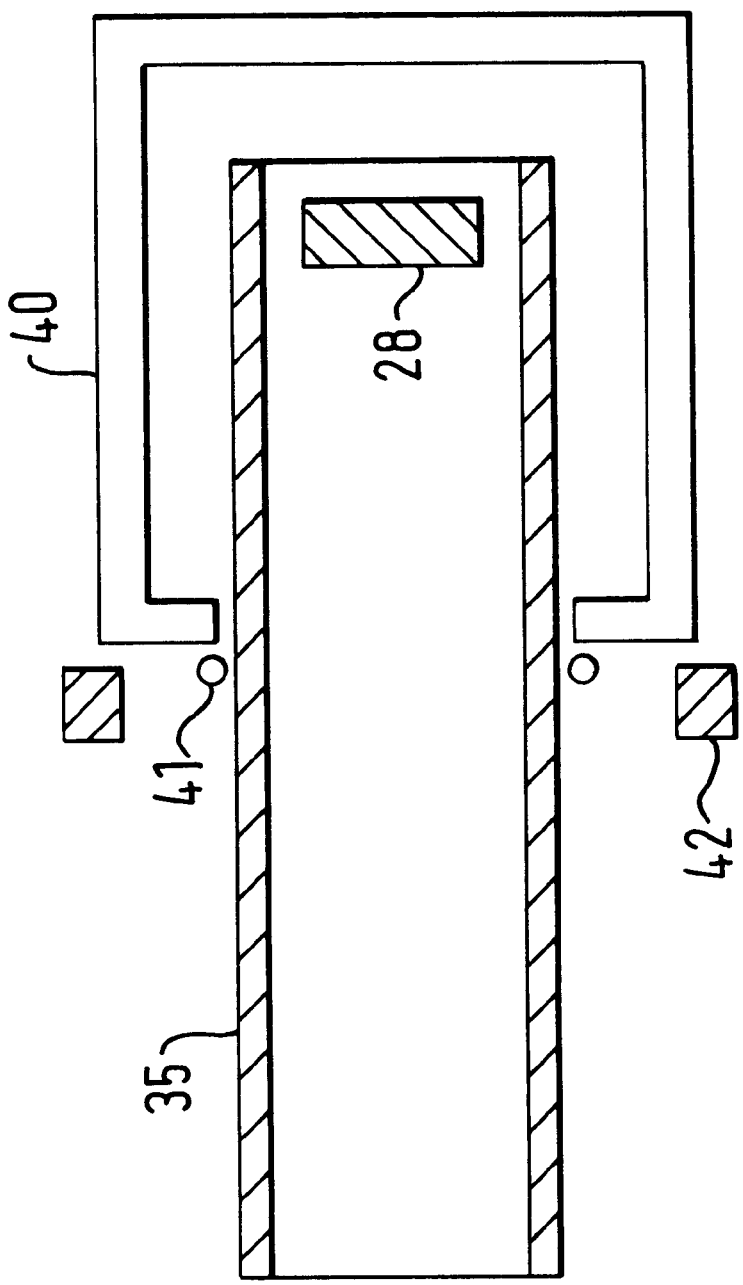
FIG. 6 is an axial section, partly in schematic form, through a modification to the second polarising unit, on a smaller scale to that of FIG. 4.

Typical overall dimensions are a cylinder approximately 90 cm long in the case of the small unit of FIG. 1 and 6 cm in diameter, and 110 cm long and 20 cm in diameter in the case of the larger one of FIG. 2.

The smaller unit of FIG. 1 could employ two pre-polarisers as in FIG. 2, or the larger unit of FIG. 2 could employ one pre-polariser only. Also, alternatives to the linear motor 13, 14 are possible for rapidly withdrawing the superconducting magnet away from the imaging region. For example, the linear motor could be replaced by a rotary motor employing an HTSC rotating rotor with a multi-screw thread drive to the rod 9. As another alternative, the HTSC block 8 could form part of a linear motor used to propel the block.

Figure 4:
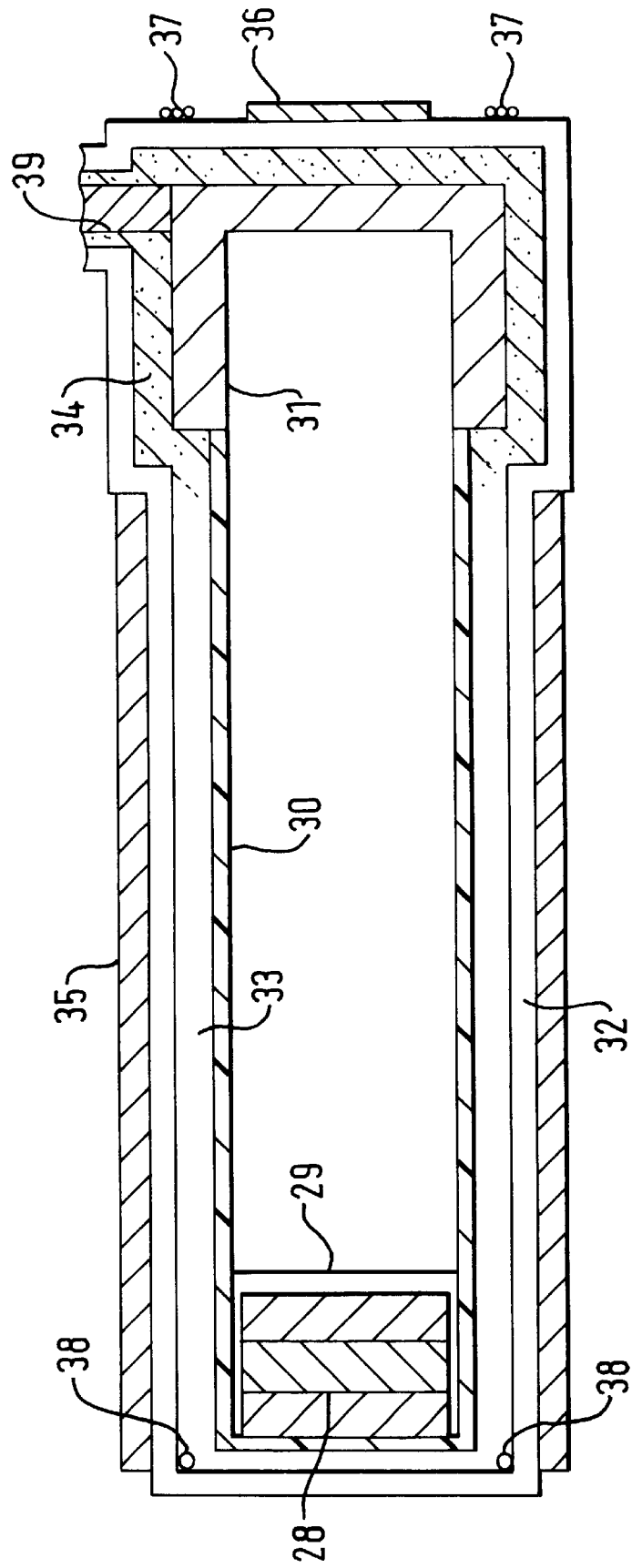
FIG. 4 is an axial section through a second form of pre-polarising unit for use in the MRI apparatus of FIGS. 1 and 2.

Thus, referring now to FIG. 4, in the second form of pre-polarising unit, an HTSC pre-polarising magnet 28 consists of one or more HTSC blocks contained in a steel can 29 which is open at the end which is to be brought near to the patient prior to imaging. The can 29 is slidable within a guide tube 30 (made for example of fibreglass reinforced with carbon fibre) to a rest position in a copper block 31 which is connected by a conductor 39, also of copper, to a cold head of a refrigeration unit.

The blocks 28, like the steel can 29 and guide tube 30 are all cylindrical.

The guide tube 30 is contained within an outer casing 32 (which may be made of the same material as the guide tube) defining a space 33 between the guide tube and the outer casing which is evacuated in order to insulate the guide tube. In the vicinity of the copper block 31, superinsulation is provided. Superinsulation is thin mylar sheet with a highly reflecting (normally) vacuum deposited coating such as aluminium.

The HTSC blocks 28 form the rotor of a linear motor, the stationary windings of which 35 are wrapped around the outside of the outer casing 32. The windings are three-phase wave wound windings spaced so as to optimise the force on the magnetised block. Wave wound windings are motor style windings wound with a number of turns that varies from place to place in a regular repeated manner to give the desired field pattern.

There is a permanent magnet 36 (for example constituted from a material sold under the trade name Neomax (Trade Name), consisting of a complex alloy of neodymium, boron and iron, adjacent to the copper refrigeration block 31 in order to hold the HTSC magnet in its rest position, without having to maintain power on the linear motor. The permanent magnet 36 is surrounded by a release winding 37. The field from the release winding, which is significantly larger in diameter than the magnet 36, opposes the field of the permanent magnet and can do this without demagnetising the permanent magnet because of its larger diameter. The release winding 37 is energised when it is desired to move the pre-polarising blocks 28 forwards.

The use in MRI apparatus of the second form of pre-polarising unit is as described for the first form of pre-polarising unit. Thus, a patient is arranged between the open, vertically spaced, pole pieces of the C-magnet 1 of low field but high homogeneity, and the pre-polarising unit is arranged with its left hand end as seen in FIG. 4 adjacent to the patient. The HTSC blocks 28 are gradually moved from the rest position in which cooling is maintained by the copper refrigeration block 31 by appropriate energisation of the windings 35, and after operation of the release windings 37. The HTSC blocks then take up the position shown in FIG. 4, in which the field in the region to be imaged is now considerably enhanced compared to that provided by the C-magnet.

An r.f. excitation pulse is emitted from a transmit coil thereby disturbing the orientation of the protons in the tissue being imaged. The HTSC magnet 28 is then rapidly withdrawn to the right hand end of the guide tube 30 as seen in FIG. 4 by energising the windings 35, and the magnetic resonance signals generated as the protons re-orientate relative to the field of the C-magnet are then received by a receive coil influenced by the main field of the C-magnet.

The withdrawal of the HTSC magnet is very rapid, and its motion is arrested by a spring (not shown), although in addition the motor windings could be controlled in a closed loop servo system to slow it.

The HTSC magnet is polarised using an external high field magnet, after it has been cooled in the copper block 31. The block is only cool when located in this region, so that is cannot leave it for too long. The block is held in this region by the permanent magnet to enable the pre-polarising unit to be moved around.

If desired, an r.f. coil 38 inside the outer casing 32 can serve as the r.f. transmit coil for the magnetic resonance imaging apparatus.

Typical dimensions would be around 40 mm diameter for the YBCO blocks and overall diameter including the motor windings of around 90 mm, and overall length of the pre-polarising unit of around 600 mm. The number of blocks depends on the size of the polarizer, and their diameter. Diameters of 60–70 mm and greater could be used. Compared to the unit described in FIG. 3, the pre-polarising unit is shorter and requires only one HTSC magnet.

The HTSC magnet is preferably magnetised using external means but the windings of the motor could be used for this purpose.

With this embodiment in which the pre-polarising block 28 forms its own motor rotor, the coil can be shorter, but a motor winding must be included along the length of the tube. In case the motor is a d.c. one and the winding has to be split into sections organised individually so as to maintain a force on the HTSC rotor in the same direction as it moves. The advantages of the method are that it saves on the quantity of HTSC, reduces the mass of rotor section, and reduces the length of the polariser. The disadvantage is an increase in the diameter of the polariser.

In order to minimise the large stray field (in NMR terms) from the HTSC 28 even in its retracted position it can be retracted into an iron box 40 as shown in FIG. 6. This traps most of the stray flux, and leakage out through the opening can be reduced further by a closure coil 41. Alternatively, a section of the magnet winding can be appropriately energised to restrict the leakage flux.

A disadvantage of the use of iron as shown in FIG. 6 is its effect on the main field of the magnet 1. Typically this would be vertical as shown in FIGS. 1 and 2, but the presence of the iron will distort it. Blocks of conventional permanent magnet 42 (such as neomax—neodymium boron iron, which can be quite small) can be used to minimise this as shown in the figure. Details of the blocks and their disposition depend on the magnet with which the pre-polariser is to be used, and the relative size of the iron box.

Figure 5:
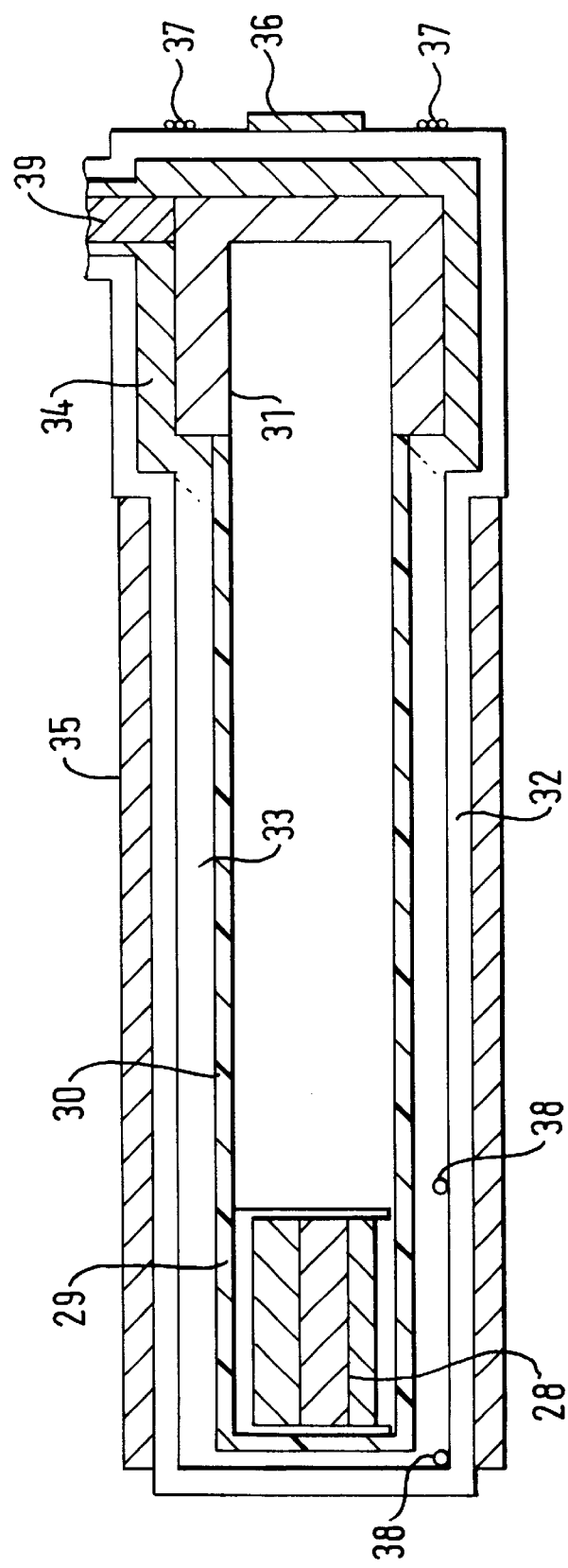
FIG. 5 is an axial section through a third form of pre-polarising unit for use in MRI apparatus.

The shielding arrangement of FIG. 6 could also be used for the first and third forms of pre-polarising unit shown in FIGS. 3 and 5.

Referring to FIG. 5, the third form of pre-polarising unit will now be described, and like parts have been given the same reference numerals as in FIG. 4. This form of pre-polarising is however used in a different orientation relative to the C-magnet.

The main difference of the embodiment of FIG. 5 from that of FIG. 4 is that the blocks 28 and the steel can 29 are rectangular in section rather than cylindrical, and in that the operative face of the HTSC magnet i.e. the face at the open end of the steel can 29 is directed in a sideways direction in the guide tube 30 rather than in an axial direction as in FIG. 2. The guide tube 30 has a rectangular section to accommodate the HTSC blocks and steel can 29, and the wave wound linear motor 35 of FIG. 1 is replaced by a solenoid 35, preferably a multi-start solenoid.

The pre-polarising unit of FIG. 5 is orientated so that its axis is at right angles to the plane of FIG. 2 of the drawing. If an r.f. coil is included in the vacuum space, it will surround the open face of the HTSC magnet as shown. The copper refrigeration block 31, the vacuum enclosure 33 with superinsulation 34, the outer casing 32, the conductive paths to the cold head 39 and the magnet 36 and release windings 37 in FIG. 5 are all the same as in FIG. 4, except to accommodate the change in dimensions of the guide tube 30 and HTSC block 28.

The HTSC magnets of the pre-polarisers of FIGS. 3 to 5 may be melt-quenched HTSC, for example, the magnets may consist of melted processed single crystal YBCO (yttrium barium copper oxide, Y—Ba—Cu—O, typically having the composition ($YBa_2Cu_3O_{7-x}$), or other high temperature superconductors may be used for example the material known as BSCCO ($Bi_2Sr_2Ca_1Cu_2O_8$ or $Bi_2Sr_2Ca_2Cu_3O_{10}$).

The invention can be used with magnets other than C-magnets, for example, H-magnets or other permanent magnets employing a yoke and pole pieces. The invention could also be used with small solenoid-type magnets. Finally, stator windings in FIGS. 3 to 5 could be hollow copper or aluminium conductors, cooled with oil or demineralised water.

The invention has been described with reference to the preferred embodiment. Obviously, modifications and alterations will occur to others upon reading an understanding the preceding description. It is intended that the invention be construed as including all such modifications and alterations insofar as they come within the scope of the appended claims or the equivalents thereof.

What is claimed is:
1. An apparatus for use in magnetic resonance imaging, the apparatus comprising:

a magnet for generating a main magnetic field in an imaging region;

means for generating time varying gradient magnetic fields in the imaging region;

means for exciting and detecting magnetic resonance in the imaging region;

a high temperature superconducting pre-polarizing magnet, the high temperature superconducting magnet being rapidly movable from a first position nearer to the imaging region to a second position further from the imaging region; and means for moving the high temperature superconducting magnet between the first and second positions.

2. The apparatus of claim 1 further including a first cooling member in thermal communication with the high temperature superconducting magnet when the high temperature superconducting magnet is in the second position.

3. The apparatus of claim 2 including a second cooling member in thermal communication with the high temperature superconducting magnet when the high temperature superconducting magnet is in the first position.

4. The apparatus of claim 2 further including an evacuated enclosure and wherein the first cooling member is disposed within the enclosure.

5. The apparatus of claim 4 wherein the high temperature superconducting magnet is disposed in the enclosure.

6. The apparatus of claim 1 including an electric motor operatively connected to the high temperature superconducting magnet and adapted to selectively urge the high temperature superconducting magnet toward the second position.

7. The apparatus of claim 6 wherein the motor includes a rotor and the rotor includes a high temperature superconducting material.

8. The apparatus of claim 7 wherein the high temperature superconducting material is integral with the high temperature superconducting magnet.

9. The apparatus of claim 7 wherein the motor includes liquid cooled windings.

10. The apparatus of claim 1 including a second high temperature superconducting magnet disposed opposite the imaging region from the first high temperature superconducting magnet.

11. The apparatus of claim 10 wherein the second high temperature magnet is rapidly movable from a first position nearer to the imaging region to a second position further from the imaging region.

12. The apparatus of claim 1 wherein the magnet for generating a magnetic field in the imaging region includes first and second pole pieces disposed on opposite sides of an imaging region and a yoke joining the first and second pole pieces.

13. The apparatus of claim 1 wherein the apparatus is adapted for imaging a human patient having a longitudinal axis and the high temperature superconducting magnet is rapidly movable from a first position nearer the imaging region and in a second position further from the imaging region along an axis parallel to the longitudinal axis of the patient.

14. A method comprising:

applying a main magnetic field within an imaging region of a magnetic resonance imaging apparatus using a magnet which includes first and second pole pieces disposed on opposite sides of an imaging region and a yoke joining the first and second pole pieces;

placing an HTSC pre-polarizing magnet in proximity to the imaging region so as to impose a second magnetic field therein;

exciting magnetic resonance in nuclei disposed in the examination region;

moving the HTSC magnet away from the imaging region; and detecting signals indicative of magnetic resonance in the nuclei.

15. The method of claim 14 wherein the step of placing is performed prior to the step of applying.

16. The method of claim 14 including placing a second HTSC magnet in relation to the imaging region so as to cancel the magnetic field imposed in the imaging region by the first HTSC magnet when the first HTSC magnet is moved away from the imaging region.

17. The method of claim 14 wherein the step of placing includes using an electric motor having an HTSC rotor to urge the HTSC magnet toward the imaging region.

18. The method of claim 17 wherein the step of moving includes using the electric motor to urge the HTSC magnet away from the imaging region.

19. The method of claim 14 further including using a magnet to hold the HTSC magnet in a position away from the imaging region.

20. An apparatus for use in magnetic resonance imaging, the apparatus comprising:

a magnet for generating a main magnetic field in an imaging region;

means for generating time varying gradient magnetic fields in the imaging region;

means for exciting and detecting magnetic resonance in the imaging region;

a high temperature superconducting pre-polarizing magnet, the high temperature superconducting magnet being rapidly movable from a first position nearer to the imaging region to a second position further from the imaging region; and a first cooling member in thermal communication with the high temperature superconducting magnet when the high temperature superconducting magnet is in the second position.

21. An apparatus for use in magnetic resonance imaging, the apparatus comprising:

a magnet for generating a main magnetic field in an imaging region, wherein the magnet for generating a magnetic field in the imaging region includes first and second pole pieces disposed on opposite sides of an imaging region and a yoke joining the first and second pole pieces;

means for generating time varying gradient magnetic fields in the imaging region;

means for exciting and detecting magnetic resonance in the imaging region; and a high temperature superconducting pre-polarizing magnet, the high temperature superconducting magnet being rapidly movable from a first position nearer to the imaging region to a second position further from the imaging region.

* * * * *